(12) United States Patent
Shenai-Khatkhate

(10) Patent No.: US 8,277,886 B2
(45) Date of Patent: *Oct. 2, 2012

(54) DELIVERY DEVICE

(75) Inventor: Deodatta Vinayak Shenai-Khatkhate, Danvers, MA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 1139 days.

This patent is subject to a terminal disclaimer.

(21) Appl. No.: 11/805,175

(22) Filed: May 22, 2007

(65) Prior Publication Data

US 2007/0266949 A1    Nov. 22, 2007

Related U.S. Application Data

(60) Provisional application No. 60/802,400, filed on May 22, 2006.

(51) Int. Cl.
*C23C 16/00* (2006.01)
(52) U.S. Cl. ..................... 427/248.1; 118/726
(58) Field of Classification Search .......... None
See application file for complete search history.

(56) References Cited

U.S. PATENT DOCUMENTS 4,916,828 A * 4/1990 Yamane et al. .......... 34/364
5,377,429 A    1/1995 Sandhu et al.
5,603,169 A    2/1997 Kim
5,989,305 A    11/1999 Ohsaki et al.
6,444,038 B1   9/2002 Rangarajan et al.
6,607,785 B2   8/2003 Timmons et al.
7,722,720 B2 * 5/2010 Shenai-Khatkhate et al. .......... 118/726

FOREIGN PATENT DOCUMENTS

| EP | 1 669 474 | 6/2006 |
| JP | 01055820 | 3/1989 |
| JP | 6-20052 | 3/1994 |
| JP | 2651530 | 9/1997 |

OTHER PUBLICATIONS

Fannin et al.; "Cause and Resolution of Problem of Erratic and Decreasing Trimethylindium Bubbler Delivery Rates"; Journal of Crystal Growth; 124 (1992); pp. 307-310.
European Search Report of corresponding European Patent Application No. EP 07 01 0065, Jul. 2, 2007.

* cited by examiner

*Primary Examiner* — Michael Cleveland
*Assistant Examiner* — Michael G Miller
(74) *Attorney, Agent, or Firm* — S. Matthew Cairns

(57) ABSTRACT

Delivery devices for delivering solid precursor compounds in the vapor phase to reactors are provided. Such devices include a precursor composition of a solid precursor compound with a layer of packing material disposed thereon. Also provided are methods for transporting a carrier gas saturated with the precursor compound for delivery into such CVD reactors.

7 Claims, 2 Drawing Sheets

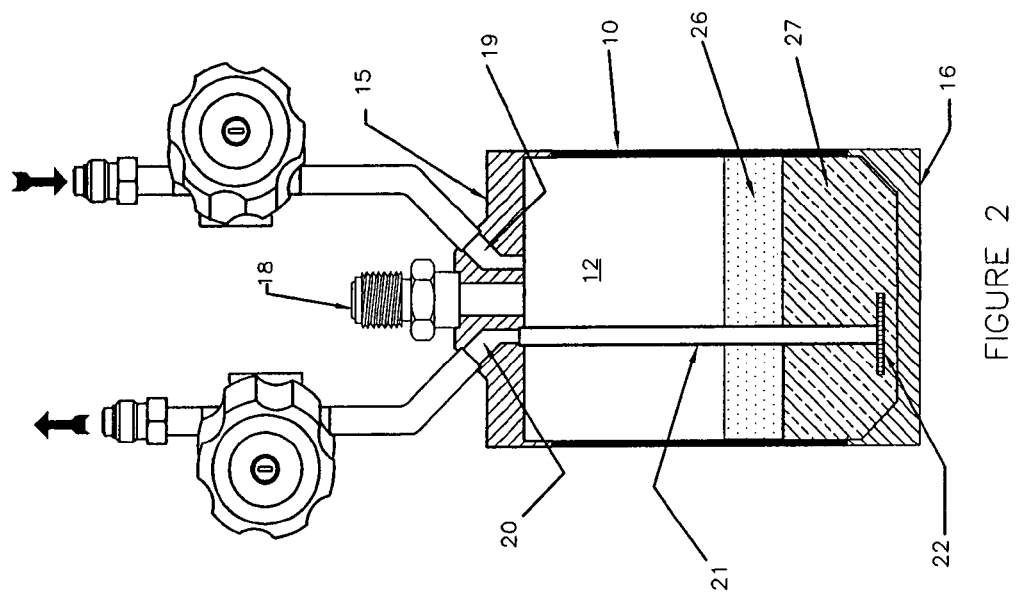

DELIVERY DEVICE

This application claims the benefit of provisional patent application Ser. No. 60/802,400, filed on May 22, 2006.

The present invention relates generally to a vapor delivery system for use in vapor deposition equipment. In particular, the present invention relates to a vapor delivery system designed for the requirements of vapor phase epitaxy and other chemical vapor deposition equipment.

Group III-V compound semiconductor materials including different monocrystalline layers with varying compositions and with thickness ranging from fractions of a micrometer to a few micrometers are used in the production of many electronic and optoelectronic devices such as lasers, light emitting diodes ("LEDS") and photodetectors. Chemical vapor deposition ("CVD") methods using organometallic compounds are typically employed for the deposition of metal thin-films or semiconductor thin-films, such as films of Group III-V compounds. Such organometallic compounds may be either liquid or solid.

In CVD methods, a reactive gas stream is typically delivered to a reactor to deposit the desired film. The reactive gas stream is typically composed of a carrier gas, such as hydrogen, saturated with precursor compound vapor. When the precursor compound is a liquid, a reactive gas stream is typically obtained by passing (i.e. bubbling) a carrier gas through the liquid precursor compound in a delivery device (i.e. a bubbler). Typically, solid precursors are placed in a cylindrical vessel or container and subjected to a constant temperature to vaporize the solid precursor. A carrier gas is employed to pick up the precursor compound vapor and transport it to a deposition system. Most solid precursors exhibit poor and erratic delivery rates when used in conventional bubbler-type precursor delivery devices. Such conventional bubbler systems can result in a non-stable, non-uniform flow rate of the precursor vapors, especially when solid organometallic precursor compounds are used. Non-uniform organometallic vapor phase concentrations produce an adverse effect on the compositions of the films, particularly semiconductor films, being grown in metalorganic vapor phase epitaxy ("MOVPE") reactors.

Delivery devices have been developed that attempt to address the problems of delivering solid precursor compounds to a reactor. While some of these delivery devices were found to provide a uniform flow rate, they failed to provide a consistently high concentration of precursor material. The inability to achieve a stable supply of feed vapor from solid precursors at a consistently high concentration is problematic to the users of such equipment, particularly in semiconductor device manufacture. The unsteady precursor flow rate can be due to a variety of factors including progressive reduction in the total surface area of chemical from which evaporation takes place, channeling through the solid precursor compound and the sublimation of the precursor solid material to parts of the delivery system where efficient contact with the carrier gas is difficult or impossible. When a channel develops through a bed of solid precursor compound the carrier gas will preferentially flow through such channel rather than through the bed of precursor compound resulting in reduced contact of the carrier gas and precursor compound. Such channeling causes a decrease in the vapor phase concentration of solid precursor compound and results in unused solid precursor compound remaining in the delivery device.

Various methods have been developed to reduce the formation of channeling in the solid precursor bed. For example, Japanese Patent No. 06-020051 B (assigned to Ube Industries) discloses a method of charging a delivery cylinder for solid organometallic compounds by charging a metallic filler into a cylinder and charging an organometallic compound on the surface of the metallic filler by sublimation. Another layer of metallic filler is placed on the organometallic compound. The cylinders disclosed in this patent contain a dip tube and have a three-layer system of an organometallic compound sandwiched between two metallic filler layers, the dip-tube passing through the top metallic filler layer and the organometallic compound layer and ending in the bottom layer of metallic filler. This approach is not without problems as certain metallic fillers used in conjunction with highly reactive organometallic compounds increase the probability of generating deleterious metallic impurities in situ which are able to be transported in the vapor phase along with the desired organometallic compound. Certain metals, such as nickel and chromium, are known to enhance the decomposition of Group III organometallic compounds. Further, a dip-tube is conventionally used to deliver a stream or carrier gas to the bottom of a cylinder. The carrier gas then travels upward through the precursor compound. When the precursor compound is a solid, the end of the dip-tube is a point source of the carrier gas stream which increases the chance of channel formation within the bed of precursor compound.

Conventional approaches to delivering a solid precursor compound in the vapor phase do not adequately provide a uniform and high concentration of precursor vapor throughout the process up to depletion of the solid precursor compound from the delivery device. There remains a need for improved delivery devices and methods for delivering a vapor of solid precursor compound where the solid precursor compound is depleted from the delivery device and where the vapor concentration of the solid precursor compound remains uniform and at a sufficiently high concentration, and where channel formation within a bed of solid precursor compound is reduced.

It has been found that a vapor phase delivery device including a precursor composition including a solid precursor compound and a layer of a packing material disposed on the solid precursor compound provides a more consistent, stable concentration of precursor compound in the vapor phase even at high flow rates, low pressures or a combination of high flow rates and low pressures as compared to the same system without such packing material. Channel formation in a bed of such precursor compound is reduced. The precursor is contained within a chamber of the delivery device. A dip-tube is contained within the chamber of the delivery device, the dip-tube being in fluid communication with and extending from a gas outlet of the chamber. A consistent and stable concentration of precursor in the vapor phase can be achieved without the need to heat the solid precursor compound at or near its decomposition temperature.

The present invention provides a vapor phase delivery device for solid precursor compounds including a cylinder including a chamber including a precursor composition; a gas inlet; a gas outlet; a fill port; and a dip-tube connected to the gas outlet; wherein the precursor composition includes a solid precursor compound and a layer of packing material disposed on the solid precursor compound. The gas used is a carrier for the solid precursor compound ("carrier gas"). In the present invention, the dip-tube is in fluid communication with the gas outlet and extends from the gas outlet to a bottom portion of the chamber. In the present delivery device, a carrier gas enters the chamber through a gas inlet, travels through the layer of packing material, travels through the bed of solid precursor compound where the carrier gas picks up precursor compound vapor, and then the carrier gas exits the chamber through the gas outlet by way of the dip-tube. Contrary to conventional use, the flow of carrier gas exits the chamber via the dip tube rather. Such an apparatus can be described as having a "reverse flow" as the carrier gas exits rather than enters the chamber via the dip-tube. Applicants have surprisingly found that this reverse flow approach along with the use of a layer of packing material disposed on the solid precursor compound provides a consistent concentration of the precursor compound in the vapor phase and allows for ≧90% depletion of the precursor compound from the delivery device.

Delivery devices including a precursor composition including a solid precursor compound and a packing material, wherein the packing material includes a stabilizing agent are provided. In one embodiment, the solid precursor compound is an organometallic compound.

Also provided by the present invention is a method of depositing a film including: a) providing the delivery device described above; b) introducing a carrier gas into the delivery device through the gas inlet; c) flowing the carrier gas through the packing material and the solid precursor compound to substantially saturate the carrier gas with the precursor compound; d) the precursor compound saturated carrier gas exiting from the delivery device through the gas outlet by way of the dip-tube; e) delivering the precursor compound saturated carrier gas to a reaction vessel containing a substrate; and f) subjecting the precursor compound saturated carrier gas to conditions sufficient to decompose the precursor compound to form a film on the substrate.

FIG. 2 is a cross-sectional view illustrative of a delivery device of the present invention having a dip-tube connected to the gas outlet and having a porous frit disposed at the lower end of the dip-tube and a solid precursor compound having a layer of packing material disposed thereon contained within the chamber.

Figure 1:
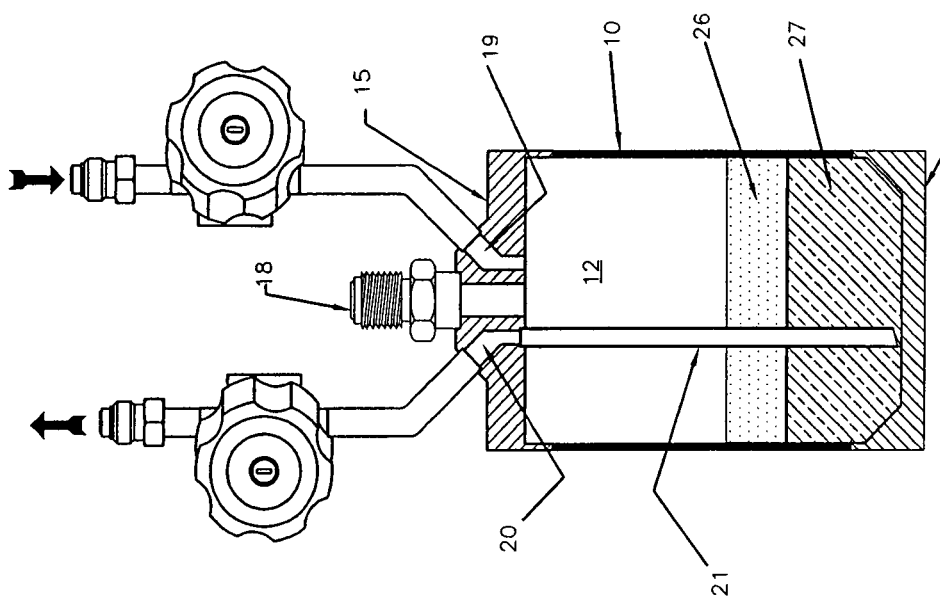
FIG. 1 is a cross-sectional view illustrative of a delivery device of the present invention having a dip-tube connected to the gas outlet and a solid precursor compound such as TMI and having a layer of packing material disposed thereon contained within the chamber.

As used throughout this specification, the following abbreviations shall have the following meanings, unless the context clearly indicates otherwise: ° C.=degrees centigrade; sccm=standard cubic centimeter per minute; cm=centimeter; mm=millimeter; μm=micron=micrometer; g=gram; kPa=kilopascals; PTFE=polytetrafluoroethylene; HDPE=high density polyethylene; and TMI=trimethyl indium.

The indefinite articles "a" and "an" include both the singular and the plural. "Halogen" refers to fluorine, chlorine, bromine and iodine and "halo" refers to fluoro, chloro, bromo and iodo. Likewise, "halogenated" refers to fluorinated, chlorinated, brominated and iodinated. "Alkyl" includes linear, branched and cyclic alkyl. As used herein, the term "precursor compound" refers to any solid compound that provides a vapor phase concentration of a component used in the growth of a film on a substrate. All numerical ranges are inclusive and combinable in any order except where it is clear that such numerical ranges are constrained to add up to 100%.

The vapor generator or delivery device of the present invention is designed to eliminate poor and erratic delivery rates exhibited by known designs as well as their inability to provide complete uniform depletion of the solid precursor compound. A wide variety of delivery devices may benefit from the present invention. The delivery device includes a cylinder including a chamber containing a precursor composition; a gas inlet; a gas outlet; a fill port; and a dip-tube, the dip-tube being connected to and in fluid communication with the gas outlet; wherein the precursor composition includes a solid precursor compound and a layer of packing material disposed on the solid precursor compound. Optionally, the dip-tube may contain a porous frit, which may be located at an end of the dip-tube located proximally to the gas outlet or at an end of the dip-tube located distally from the gas outlet or anywhere along the length of the dip-tube.

In one embodiment, a suitable delivery device is one having an elongated cylindrical shaped portion having an inner surface of a substantially constant cross-section throughout the length of the cylindrical portion, a top closure portion, and a bottom closure portion defining a chamber, a fill plug, a gas inlet, and gas outlet, wherein the fill plug, gas inlet, and gas outlet are each in fluid communication with the chamber, and a dip-tube connected to and in fluid communication with the gas outlet.

These delivery devices (or cylinders) may be constructed of any suitable material, such as, but not limited to, glass, PTFE and metal, as long as the material is inert to the precursor compound contained therein and is able to withstand the temperature and pressure conditions during use. Typically, the cylinder is constructed of a metal. Exemplary metals include, without limitation, nickel alloys and stainless steels. Suitable stainless steels include, but are not limited to, 304, 304 L, 316, 316 L, 321, 347 and 430. Exemplary nickel alloys include without limitation INCONEL, MONEL, and HASTELLOY. It will be appreciated by those skilled in the art that a mixture of materials may be used in the manufacture of such cylinders.

The cross-sectional dimension of the delivery device (cylinder) may vary over a wide range. However, the cross-sectional dimension is generally critical to the performance of the cylinder for a given application, otherwise the dimensions of the cylinder are not critical and are dependent upon, among others, the carrier gas flow, the solid precursor compound to be used, and the particular chemical vapor deposition system used. The cross-sectional dimension affects heat transfer and determines, at a given pressure and flow rate, the linear velocity of the gas in the cylinder, which in turn controls the contact time between the solid precursor compound and carrier gas and thus saturation of the carrier gas. Typically, the cylinder has a cross-sectional dimension (diameter) of 5 cm (2 inches) to 15 cm (6 inches), and more typically 5 cm, 7.5 cm (3 inches) or 10 cm (4 inches). The other dimensions for a particular cylinder are well within the ability of those skilled in the art. Suitable cylinders as those marketed by Rohm and Haas Electronic Materials LLC (Marlborough, Mass.).

A solid precursor compound is contained within the chamber. Such solid precursor compound is the source of precursor compound vapor. Any solid precursor compound suitable for use in vapor delivery systems may be used in the present invention. Suitable precursor compounds include, without limitation: indium compounds, zinc compounds, magnesium compounds, aluminum compounds, and gallium compounds. Exemplary precursor compounds include, without limitation: trialkyl indium compounds such as trimethyl indium and tritertiarybutyl indium; trialkyl indium-amine adducts; dialkyl haloindium compounds such as dimethyl chloroindium; alkyl dihaloindium compounds such as methyl dichloroindium; cyclopentadienyl indium; trialkyl indium-trialkyl arsine adducts such as trimethyl indium-trimethyl arsine adduct; trialkyl indium-trialkyl-phosphine adducts such as trimethyl indium-trimethyl phosphine adduct; alkyl zinc halides such as ethyl zinc iodide; cyclopentadienyl zinc; ethylcyclopentadienyl zinc; alane-amine adducts; alkyl dihaloaluminum compounds such as methyl dichloroaluminum; alkyl dihalogallium compounds such as methyl dichlorogallium; dialkyl halogallium compounds such as dimethyl chlorogallium and dimethyl bromogallium; biscyclopentadienyl magnesium ("Cp$_2$Mg"); carbon tetrabromide; metal beta-diketonates, such as beta-diketonates of hafnium, zirconium, tantalum and titanium; metal dialkylamido compounds such as tetrakis(dimethylamino)hafnium; silicon compounds and germanium compounds such as bis(bis(trimethylsilyl)amino) germanium. In the above precursor compounds, the term "alkyl" refers to (C$_1$-C$_6$)alkyl. Mixtures of precursor compounds may be used in the present delivery devices.

Optionally, the solid precursor compound may be fritted. As used herein, "fritting" refers to the fusing of the solid precursor compound. It has been found that a frit of solid precursor compound in a cylinder enables a more consistent, stable concentration of precursor compound in the vapor phase and provides better depletion of the solid precursor compound from the cylinder as compared conventional techniques. A "frit of solid precursor compound" refers to a fused cake of solid precursor compound having a substantially level top surface and sufficient porosity to allow the carrier gas to pass through the cake. In general, when the frit of solid precursor compound is first formed, it conforms to the internal dimensions of the cylinder, that is, the frit has a width substantially equal to the interior dimension of the inlet chamber. The height of the frit will depend upon the amount of solid precursor compound used.

Fritting is typically accomplished by subjecting the solid precursor compound to conditions that provide a frit of the solid precursor compound having a substantially level surface. Typically, the solid precursor compound is first added to the cylinder (e.g., to the chamber), the cylinder is agitated to provide the solid precursor compound with a substantially level surface, the solid precursor compound is then fritted to form a frit of the solid precursor compound. Such fritting step may optionally be performed with heating and is preferably performed with heating. In another embodiment, the agitation step may be performed with heating. Agitation may be performed by any suitable means, such as, but not limited to, tapping, vibrating, rotating, oscillating, rocking, stirring, pressurizing, vibrating by electrostrictive or magnetostrictive transducers, or shaking the cylinder to provide a level top surface of the precursor compound. Combinations of such agitation methods may be used.

The heating step is performed at a temperature below the decomposition temperature of the solid precursor compound. Typically, the heating step is performed at a temperature of up to 5° C. below the decomposition temperature of the solid precursor compound, and more typically up to 10° C. below the decomposition temperature of the solid precursor compound. For example, TMI may be fritted at a temperature of 35-50° C. Such controlled heating may be performed using a water bath, an oil bath, hot air, a heating mantle and the like. The fritting step is performed for a period of time sufficient to fuse the solid precursor compound into a frit. The time used for the fritting step depends on the particular solid precursor compound used, the amount of the solid precursor compound, and the particular temperature used, among other factors. Alternatively, the fritting step may be performed under reduced pressure.

The particular porosity of the precursor compound frit depends upon the fritting temperature used, the particular precursor compound used and the starting particle size of the precursor compound, among other factors. Smaller particles of solid precursor compound will typically provide a frit having smaller pores as compared to a frit formed from larger particles of the same solid precursor compound. As used herein, "pore" refers to the space between particles of fused solid precursor compound.

A desired particle size of the solid precursor compound may be obtained by a variety of methods, such as, but not limited to, crystallization, grinding, and sieving. The solid precursor compound may be dissolved in a solvent and crystallized by cooling, by the addition of a non-solvent or by both to provide the desired particles. Grinding may be performed manually, such as with a mortar and pestle, or by machine such as using a grinding mill. Particles of the solid precursor compound may be sieved to provide solid precursor compound having a substantially uniform particle size. Combinations of such methods may be employed to obtain precursor compound in the desired particle size. In an alternative embodiment, solid precursor compound having particles having different particle sizes may be used. The use of such different particle sizes may provide a frit of the solid precursor compound having varying pore sizes.

In a further embodiment, the frit of the solid precursor compound may contain a porosity gradient, i.e., a gradient of pore sizes. Such pore size gradient may be obtained by fritting a gradient of particles of the solid precursor compound having varying sizes. Such gradient can be formed by sequentially adding particles of increasing (or decreasing) size to the cylinder; and agitating the cylinder to provide the solid precursor compound with a level surface; and fritting the solid precursor compound.

In yet another embodiment, the frit of the solid precursor compound may contain regions of different pore sizes. For example, the frit may contain a region having a relatively large pore size, e.g. 5 µm, and a region having a relatively small pore size, e.g. 2 µm. There may be one or more of each region. When there are more than one of each region, such regions may be alternating. Additionally, there may be one or more other regions having yet different pore sizes.

Pore sizes in the frit of solid precursor compound may also be controlled by using one or more of certain porosity forming aids, such as organic solvents or other removable agent. Any organic solvent that does not react with the precursor compound may be used. Typical organic solvents include, without limitation, aliphatic hydrocarbons, aromatic hydrocarbons, amines, esters, amides, and alcohols. Such organic solvents do not need to, but may, dissolve the solid precursor compound. In one embodiment, a slurry of the precursor compound and solvent is added to a cylinder. A substantially level surface of the slurry is formed. The solvent is then removed and the solid precursor compound is fritted. It will be appreciated by those skilled in the art that the solvent may be removed before, during or after the fritting step.

A wide variety of packing materials (filler) may be used in the present invention, provided that they are inert to the solid precursor compound and the cylinder under the conditions of use. Typically, the packing material is flowable. For example, as the precursor compound is depleted from the cylinder, the level of precursor compound in the cylinder will decrease and the packing material needs to flow such that it fills in any depressions in the surface of the precursor compound layer. Suitable packing materials include, without limitation, ceramics, glasses, clays, graphite and organic polymers. Exemplary packing materials include alumina, silica, silicon carbide, silicon nitride, borosilicates, alumina silicates and graphite balls such as Bucky balls. Mixtures of different packing materials may also be used. In one embodiment, the packing material is not an elemental metal such as nickel or metal alloy such as stainless steel. Packing materials do include precursor compounds and other materials containing metals in combination with non-metal elements. In another embodiment, an organometallic compound used as the packing material may be the same as the precursor compound. For example, a solid precursor compound that is a powder may be compressed to form pellets. The pelletized precursor compound may be used as the packing material on a layer of the same precursor compound (that is not in pelletized form).

In another embodiment, packing materials offering additional advantages such as stabilizing agents, may be employed in the present invention, provided that they are inert to the solid precursor compound and the cylinder under the conditions of use. Exemplary stabilizing agents include without limitation oxygen scavengers (getters), thermal stabilizers, antioxidants, anti-static agents, free-radical scavengers, and tagging (marking) agents. Suitable getter material includes, without limitation, compounds and formulations containing compounds of oxygen reactive metals such as sodium, potassium, lithium, aluminum, indium, gallium, manganese, cobalt, copper, barium, calcium, lanthanum, thorium, magnesium, chromium and zirconium. In one embodiment, the stabilizing agent is a member of the class of ionic salts that are non-polar and non-volatile such as tetraorganylammonium compounds mixed with organoaluminums; salts of aluminum, indium and gallium; organolithiums; metallocenes of magnesium, zirconium, and lanthanum; metal beta-diketonates including dipivaloylmethanato ("dpm") compounds of aluminum, indium, gallium, barium, strontium and copper and hexafluoroacetylacetonato ("hfac") compounds of aluminum, indium, gallium, barium, strontium and copper. The packing material may optionally contain a stabilizing agent or may itself be a stabilizing agent.

The packing material may be any of a wide variety of shapes, such as, but not limited to, beads, rods, tubes, horseshoes, rings, saddles, discs, saucers, or any other suitable form such as aciform, cruciform, and helicoids (coils and spirals). Packing materials are generally commercially available from a variety of sources. Although the packing material may be used as is, it is typically cleaned prior to use, such as by solvent washing and drying.

Packing material having a variety of sizes (e.g. diameters), such as 0.05 mm or greater, such as up to 5 mm or even larger may be used. A suitable range of sizes for the packing material is from 0.1 to 5 mm. The packing material may be of a uniform size or may be a mixture of sizes. In one embodiment, the size of the packing material is selected such that it is substantially the same as the particle size of the precursor compound, i.e. the mean size of the packing material is within 25% of the mean particle size of the precursor compound. Typically, the mean size of the packing material is within 20% of the particle size of the precursor compound, more typically within 15% and still more typically within 10%.

The precursor composition is typically prepared by introducing a layer (or bed) of the solid precursor compound to the chamber of the delivery device followed by depositing a layer of the packing material on the surface of the solid precursor compound. The solid precursor material may be added to the delivery device by any suitable means, including sublimation and mechanical means. Likewise, the packing material may be layered on the solid precursor compound by any suitable means. When the solid precursor compound is fritted, the packing material may be added prior to, during or after the fritting step. In an alternate embodiment, the precursor composition is prepared by introducing both the solid precursor compound and the packing material to a delivery device followed by subjecting the delivery device to conditions which provide a bottom layer of solid precursor compound and an upper layer (or "top layer") of packing material. "Top layer" refers to the layer of material through which the carrier gas must first pass.

The volume ratio of solid precursor compound to packing material may vary over a wide range, such as from 10:1 to 1:10. Typically, the volume ratio is in the range of 1:4 to 4:1.

Any suitable carrier gas may be used with the present cylinders as long as it does not react with the precursor compound. The particular choice of carrier gas depends upon a variety of factors such, among others, as the precursor compound used and the particular chemical vapor deposition system employed. Suitable carrier gasses include, but are not limited to, hydrogen, nitrogen, argon, helium and the like. The carrier gas may be used with the present cylinders at a wide variety of flow rates. Such flow rates are a function of the cylinder cross-sectional dimension and pressure. Larger cross-sectional dimensions allow higher carrier gas flows, i.e. linear velocity, at a given pressure. For example, when the cylinder has a 5 cm cross-sectional dimension, carrier gas flow rates of up to 500 sccm and greater may be used. The carrier gas flow entering the cylinder, exiting the cylinder or both entering and exiting the cylinder may be regulated by a control means. Any conventional control means may be used, such as manually activated control valves or computer activated control valves.

The delivery device may be used at a variety of temperatures. The particular temperature will depend upon the particular precursor compound used and desired application. The temperature controls the vapor pressure of the precursor compound, which controls the flux of the material needed for specific growth rates or alloy compositions. Such temperature selection is well within the ability of one skilled in the art. For example, when the precursor compound is trimethyl indium, the temperature of the cylinder may be from 10 to 60° C. Other suitable temperature ranges include from 35 to 55° C., and from 35 to 50° C. The present cylinders may be heated by a variety of heating means, such as by placing the cylinder in a thermostatic bath, by direct immersion of the cylinder in a heated oil bath or by the use of a halocarbon oil flowing through a metal tube, such as a copper tube, surrounding the cylinder.

The carrier gas enters the cylinder chamber through the gas inlet opening which is typically at an upper portion of the cylinder, e.g. at an upper portion of a cylinder side or in the top closure portion of the cylinder. The carrier gas passes through the layer of packing material and then passes through the layer of solid precursor compound and picks up vaporized precursor compound to form a gas stream including vaporized precursor compound admixed with carrier gas. The amount of vaporized compound picked up by the carrier gas may be controlled. It is preferred that the carrier gas is saturated with vaporized precursor compound. The vapor saturated carrier gas is directed to the gas outlet by way of the dip-tube. The vapor saturated carrier gas then exits the chamber through the gas outlet opening and is directed to a chemical vapor deposition system. The delivery devices of the present invention may be used with any suitable chemical vapor deposition system.

After the solid precursor compound has been depleted from the cylinder, the packing material remains in cylinder. Such packing material may be recycled and reused. When the packing material includes a stabilizing agent, such as an oxygen scavenger, such packing material may be recycled and regenerated, if applicable, prior to reuse. Typically, all packing materials will be cleaned prior to reuse.

Referring to the figures, like reference numerals refer to like elements. FIG. 1 is a cross-sectional view illustrative of a delivery device of the present invention having a dip-tube connected to the gas outlet and a solid precursor compound such as TMI and having a layer of packing material disposed thereon contained within the chamber. In this embodiment, the delivery device is composed of an elongated cylindrical container 10 which has a substantially constant cross-section throughout its length, a top closure portion 15 and a bottom closure portion 16 which define a chamber 12. Top closure portion 15 has fill port 18, gas inlet opening 19, gas outlet opening 20 and dip-tube 21 connected to and communicating with gas outlet opening 20. Carrier gas flow entering the container through gas inlet opening tube 19 is regulated by a first control valve. Carrier gas flow exiting the container through gas outlet opening 20 is regulated by a second control valve. A precursor composition including solid precursor compound 27 such as TMI and a layer of packing material 26 such as silica, borosilicate glass, or alumina disposed on solid precursor compound 27 is located within chamber 12. Solid precursor compound 27 may optionally be fritted.

Carrier gas enters the container through gas inlet opening 19 and into the chamber 12 containing the solid precursor compound / packing material composition. The carrier gas passes through the layer of packing material 26 and then passes through the solid precursor compound 27 and picks up vaporized precursor compound to form a gas stream. The gas stream exits the chamber 12 through dip-tube 21 and then through gas outlet opening 20 and then is directed into a chemical vapor deposition system.

FIG. 2 is a cross-sectional view illustrative of a delivery device of the present invention having a dip-tube connected to the gas outlet and having a porous frit disposed at the lower end of the dip-tube and a solid precursor compound having a layer of packing material disposed thereon contained within the chamber. In this embodiment, like reference numerals refer to the same elements as in FIG. 1. Dip-tube 21 contains a porous element 22 located at the end of the dip-tube located distally from the gas outlet opening 20. Alternatively, porous element 22 may be located at the end of dip-tube 21 located proximally to the gas outlet 20 or porous element 22 may be located anywhere along the length of dip-tube 21. The alternative placements of porous element 22 are not shown. The porous element is typically a frit having a controlled porosity. Porous elements having a wide variety of porosities may be used in the present invention. The particular porosity will depend upon a variety of factors well within the ability of those skilled in the art. Typically, the porous element has a pore size of from 1 to 100 μm, more typically from 1 to 10 μm. However, porous elements having porosities greater than 100 μm may be suitable for certain applications. Likewise, porous elements having porosities less than 1 μm may be suitable for certain applications. Any material may be used to construct the porous element provided it is inert to the organometallic compound used under the conditions employed and the desired porosity can be controlled. Suitable materials for forming the porous element include, but are not limited to, glass, PTFE and metals such as stainless steels and nickel alloys. Any of the above described stainless steels and nickel alloys may suitably be used. Typically, the porous element is a sintered metal, and more typically stainless steel.

Referring to FIG. 2, the carrier gas enters the container through gas inlet opening 19 and into the chamber 12 containing the solid precursor compound/packing material composition. The carrier gas passes through the layer of packing material 26 and then passes through the solid precursor compound 27 and picks up vaporized precursor compound to form a gas stream. The gas stream exits the chamber 12 by passing through porous element 22 and dip-tube 21 and then through gas outlet opening 20 and then is directed into a chemical vapor deposition system.

In an alternate embodiment, the packing material 26 in FIGS. 1 or 2 includes a stabilizing agent such as an oxygen scavenger. When the packing material includes a stabilizing agent, the layer of packing material may dry and/or purify (e.g. remove oxygen) the carrier gas before the carrier gas contacts the solid precursor compound. Additional benefits can be obtained when a stabilizer-containing packing material is intermixed with the solid precursor compound. For example, intermixing of a solid precursor compound and an oxygen scavenging packing material provides increased contact between the vapor/gas stream and the packing material which increases the ability of the packing material to scavenge oxygen from the precursor compound.

Accordingly, the present invention provides a method of providing a fluid gas stream composed of a carrier gas saturated with precursor compound to a chemical vapor deposition system including the steps of: a) providing the delivery device described above; b) introducing a carrier gas into delivery device through the gas inlet; c) flowing the carrier gas through the packing material and the solid precursor compound to substantially saturate the carrier gas with the precursor compound; and d) the compound saturated carrier gas exiting from the delivery device through the gas outlet. Typically, the carrier gas is at a sufficient flow rate to pass through the packing material and precursor compound such that the carrier gas contains a sufficient amount of precursor compound in the vapor phase, i.e. substantially saturated, to be used in film growth in a CVD reactor.

In another embodiment, the present invention provides a method of providing a fluid gas stream composed of a carrier gas saturated with precursor compound to a chemical vapor deposition system including the steps of: a) providing a the delivery device described above; b) introducing a carrier gas into the inlet chamber through the gas inlet opening; c) flowing the carrier gas through the layer of packing material and contacting the solid precursor compound to substantially saturate the carrier gas with the precursor compound; d) the precursor compound saturated carrier gas exiting from the chamber through the gas outlet by way of the dip-tube.

A chemical vapor deposition system includes a deposition chamber, which is typically a heated vessel within which is disposed at least one, and possibly many, substrates. The deposition chamber has an outlet, which is typically connected to a vacuum pump in order to draw by-products out of the chamber and to provide a reduced pressure where that is appropriate. MOCVD can be conducted at atmospheric or reduced pressure. The deposition chamber is maintained at a temperature sufficiently high to induce decomposition of the vaporized precursor compound. The typical deposition chamber temperature is from 300 to 1000° C., the exact temperature selected being optimized to provide efficient deposition. Optionally, the temperature in the deposition chamber as a whole can be reduced if the substrate is maintained at an elevated temperature, or if other energy such as radio frequency ("RF") energy is generated by an RF source.

Exemplary substrates for deposition, in the case of electronic device manufacture, may be silicon, gallium arsenide, and indium phosphide. Substrates including other materials may also be suitably used. Such substrates are particularly useful in the manufacture of integrated circuits.

Deposition is continued for as long as desired to produce a metal film having the desired properties. Typically, the film thickness will be from several hundred to several thousand angstroms or more when deposition is stopped.

Also provided by the present invention is a method of depositing a film including the steps of: a) providing the delivery device described above; b) introducing a carrier gas into the delivery device through the gas inlet; c) flowing the carrier gas through the packing material and the solid precursor compound to substantially saturate the carrier gas with the precursor compound; d) the precursor compound saturated carrier gas exiting from the delivery device through the gas outlet by way of the dip-tube; e) delivering the precursor compound saturated carrier gas to a reaction vessel containing a substrate; and f) subjecting the precursor compound saturated carrier gas to conditions sufficient to decompose the precursor compound to form a film on the substrate.

In yet another embodiment, the present invention provides a method of depositing a film including the steps of: a) providing a vessel having an elongated cylindrical shaped portion, a top closure portion, and a bottom closure portion defining a chamber; the top closure portion having a fill plug, a gas inlet opening and a gas outlet opening; a dip-tube located within the chamber and being connected to and in fluid communication with the gas outlet opening; the fill plug and gas inlet opening communicating with the chamber; and a precursor composition contained within the chamber, the precursor composition including a solid precursor compound and a layer of a packing material disposed on the solid precursor compound; b) introducing a carrier gas into the chamber through the gas inlet opening; c) flowing the carrier gas through the layer of packing material and contacting the solid precursor compound to substantially saturate the carrier gas with the precursor compound; d) the compound saturated carrier gas exiting from the chamber through the gas outlet opening by way of the dip-tube; e) delivering the precursor compound saturated carrier gas to a reaction vessel containing a substrate; and f) subjecting the precursor compound saturated carrier gas to conditions sufficient to decompose the precursor compound to form a film on the substrate.

The present invention may be used at a variety of system pressures, temperatures and flow rates. The delivery devices of the present invention have the additional advantage of providing uniform carrier gas with consistent maximum saturation that flows through the packed solid precursor compound/packing material layered composition. A further advantage of the present invention is that a bottom layer of packing material is avoided. By "bottom layer" of packing material is meant a layer of packing material disposed between the bottom of the cylinder chamber and the bed of solid organic precursor compound.

The following examples are expected to illustrate further various aspects of the present invention.

EXAMPLE 1

TMI (100 g) is added to a 5 cm (2 inch) conventional cylinder (marketed by Rohm and Haas Electronic Materials LLC) which is equipped with a gas inlet, a gas outlet, a fill port and a dip-tube connected to the gas outlet. The TMI is ground to a fine powder prior to addition to the cylinder. The cylinder is agitated by gently tapping the cylinder on a hard surface at room temperature to provide a bed of TMI having a substantially level surface. Freshly cleaned dry quartz filler (0.3 mm diameter, 145 g) is disposed as a top layer on the TMI.

A testing apparatus consisting of a mass flow controller, pressure controller, EPISON™ ultrasonic module, constant temperature bath, vacuum pump and associated valves and piping is used to measure flow stability and saturated vapor flow. The cylinder is installed in the system. The constant temperature bath is maintained at 30° C., the system pressure is maintained at 80 kPa (600 mm Hg), and a hydrogen carrier gas flow is maintained at 400 sccm. Both the flow rate and pressure should be maintained constant during the course of the evaluation. A stable concentration of TMI vapor in hydrogen is expected for over 130 hours, as measured by the ultrasonic monitor. After 130 hours the concentration of TMI in the vapor phase is expected to drop. A depletion of the amount of TMI of >90% after 130 hours is expected.

EXAMPLE 2

The procedure of Example 1 is repeated except that the TMI is fritted before the addition of the packing material. The TMI is fritted by allowing the cylinder to stand overnight (approximately 12 hours) at 30° C. in a constant temperature bath.

EXAMPLE 3

The procedure of Example 1 is repeated except that the $Cp_2Mg$ is used. The $Cp_2Mg$ is first ground to a substantially uniform size of 3-4 mm. A constant particle size is ensured by passing the $Cp_2Mg$ powder though precision sieves. Material that passes a #5 sieve but is retained in a #7 sieve is transferred to the cylinder. Using similar conditions to Example 1, similar results are expected to be obtained.

EXAMPLE 4

The procedure of Example 3 is repeated except that carbon tetrabromide is used as the solid precursor compound. A stable concentration of carbon tetrabromide in the vapor phase is expected up to 90-95% depletion of the amount of carbon tetrabromide from the cylinder at 25° C.

EXAMPLE 5

The procedure of Example 1 is repeated except that the constant temperature bath is maintained at 17° C., the system pressure is maintained at 40 kPa (300 mmHg), and a hydrogen carrier gas flow is maintained at 1000 sccm. A stable concentration of TMI vapor in the hydrogen carrier gas is expected to be maintained as measured by the ultrasonic monitor. Depletion $\geq$90% of the amount of TMI is expected.

EXAMPLES 5-26

The procedure of Example 1 is repeated except that the following solid precursor compounds ("PC") and packing materials ("PM") are used. Whether the solid organometallic compounds are fritted is indicated in the following table, "Y"=yes and "N"=no.

| Example | Precursor Compound | PC Fritted | Packing Material (particle size) | Volume Ratio of PC:PM |
|---|---|---|---|---|
| 5 | TMI | Y | Silica (0.25 mm) | 1:1 |
| 6 | TMI | N | Alumina beads (0.75 mm) | 1:1.1 |
| 7 | TMI | Y | Silica beads (0.5 mm) | 1.2:1 |
| 8 | TMI | N | PTFE beads (1 mm) | 1.5:1 |

| Example | Precursor Compound | PC Fritted | Packing Material (particle size) | Volume Ratio of PC:PM |
|---|---|---|---|---|
| 9 | TMI | Y | Silica beads (0.55 mm) | 1.75:1 |
| 10 | Cp$_2$Mg | Y | HDPE saddles (0.75 mm) | 1:15.1 |
| 11 | Tris(dimethylamido)aluminum | Y | PYREX ™ rings (1.25 mm) | 1.25:1 |
| 12 | Tris(ethylmethylamido)gallium | N | PYREX ™ coils (1.5 mm) | 2.05:1 |
| 13 | Dimethyl chloroindium | Y | Alumina beads (0.5 mm) | 1.1:1 |
| 14 | Tris(dimethylamido)indium | N | Silica rings (1 mm) | 1.2:1 |
| 15 | Tri(tert-butyl)indium | N | PTFE beads (0.6 mm) | 1:1.05 |
| 16 | Cyclopentadienyl indium | Y | Alumina tubes (1.2 mm) | 1.2:1 |
| 17 | Cyclopentadienyl zinc | N | Silica tubes (0.4 mm) | 1:1.15 |
| 18 | Tetrakis(dimethylamino)hafnium | Y | Borosilicate rings (0.5 mm) | 1.25:1 |
| 19 | Tetrakis(dimethylamino)zirconium | N | Alumina rods (1 mm) | 1:1.1 |
| 20 | Ruthenium biscyclopentadienide | N | PTFE discs (0.8 mm) | 1.33:1 |
| 21 | Ruthenium tricarbonyl amidinate | Y | Borosilicate beads (0.5 mm) | 1.25:1 |
| 22 | Alane-trimethyl amine adduct | N | Glass beads (0.75 mm) | 1.1:1 |
| 23 | Magnesium bisamidinate | Y | Borosilicate beads (0.5 mm) | 1:1.25 |
| 24 | Tungsten hexacarbonyl | Y | Glass beads (0.75 mm) | 1.1:1 |
| 25 | TMI | Y | Borosilicate beads (0.6 mm) + O$_2$ reactive aluminum compound (0.25–0.75 mm) | 3:1 |
| 26 | TMI | N | Graphite balls (0.75 mm) + O$_2$ reactive lithium compound (0.5–0.75 mm) | 2:1.2 |

The compositions in the Table are expected to provide consistent, stable vapor phase concentrations of precursor compound for extended periods, as compared to systems where no packing materials are used.

What is claimed is:

1. A vapor phase delivery device for a solid precursor compound comprising a cylinder comprising a single chamber, the chamber comprising a single precursor composition; a gas inlet; a gas outlet; a fill port; and a dip-tube contained within the chamber and connected to the gas outlet; wherein the precursor composition consists of a solid precursor compound and a single layer of packing material disposed on the solid precursor compound.

2. The vapor phase delivery device of claim 1 wherein the solid precursor compound is chosen from: trialkyl indium compounds; trialkyl indium-amine adducts; dialkyl haloindium compounds; alkyl dihaloindium compounds; cyclopentadienyl indium; trialkyl indium-trialkyl arsine adducts; trialkyl indium-trialkyl-phosphine adducts; alkyl zinc halides; cyclopentadienyl zinc; ethylcyclopentadienyl zinc; alkyl dihaloaluminum compounds; alane-amine adducts; alkyl dihalogallium compounds; dialkyl halogallium compounds; biscyclopentadienyl magnesium; silicon compounds; germanium compounds; carbon tetrabromide; metal dialkylamides; and metal beta-diketonates.

3. The vapor phase delivery device of claim 1 wherein the packing material is chosen from ceramics, glasses, clays, graphite and organic polymers.

4. The vapor phase delivery device of claim 1 wherein the dip-tube further comprises a porous element.

5. The vapor phase delivery device of claim 1 wherein the solid precursor compound is fritted.

6. The vapor phase delivery device of claim 1 wherein the packing material comprises a stabilizing agent chosen from oxygen scavengers, antioxidants, anti-static agents, free-radical scavengers and tagging agents.

7. The vapor phase delivery device of claim 1 wherein the dip-tube extends from the gas outlet to a bottom portion of the chamber.

* * * * *